United States Patent
Su et al.

(10) Patent No.: US 9,129,878 B2
(45) Date of Patent: Sep. 8, 2015

(54) MECHANISMS FOR FORMING BACKSIDE ILLUMINATED IMAGE SENSOR DEVICE STRUCTURE

(71) Applicant: Taiwan Semiconductor Manufacturing Co., Ltd., Hsin-Chu (TW)

(72) Inventors: Bo-Chang Su, Tainan (TW); Chih-Ho Tai, Tainan (TW); Wei-Chih Weng, Tainan (TW); Hsun-Ying Huang, Tainan (TW); Hsien-Liang Meng, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 59 days.

(21) Appl. No.: 14/029,402

(22) Filed: Sep. 17, 2013

(65) Prior Publication Data

US 2015/0076638 A1    Mar. 19, 2015

(51) Int. Cl.
*H01L 31/0232* (2014.01)
*H01L 27/146* (2006.01)

(52) U.S. Cl.
CPC ...... *H01L 27/1464* (2013.01); *H01L 27/14625* (2013.01); *H01L 27/14636* (2013.01); *H01L 27/14643* (2013.01); *H01L 27/14689* (2013.01)

(58) Field of Classification Search
CPC ............ H01L 27/14643; H01L 27/1464; H01L 27/14636; H01L 2924/00; H01L 27/14685
USPC ............ 257/432, 437, E27.13, E31.119, 257/E31.127
See application file for complete search history.

(56) References Cited

U.S. PATENT DOCUMENTS

| | | | |
|---|---|---|---|
| 7,400,003 B2 * | 7/2008 | Lee et al. | 257/291 |
| 8,610,229 B2 * | 12/2013 | Hsu et al. | 257/432 |
| 2012/0038015 A1 * | 2/2012 | Huang et al. | 257/437 |

* cited by examiner

*Primary Examiner* — Andy Huynh
(74) *Attorney, Agent, or Firm* — Birch, Stewart, Kolasch & Birch, LLP

(57) ABSTRACT

Embodiments of mechanisms of a backside illuminated image sensor device structure are provided. The backside illuminated image sensor device structure includes a substrate having a frontside and a backside and a pixel array formed in the frontside of the substrate. The backside illuminated image sensor device structure further includes an antireflective layer formed over the backside of the substrate, and the antireflective layer is made of silicon carbide nitride.

16 Claims, 4 Drawing Sheets

MECHANISMS FOR FORMING BACKSIDE ILLUMINATED IMAGE SENSOR DEVICE STRUCTURE

BACKGROUND

Integrated circuit (IC) technologies are constantly being improved. Such improvements frequently involve scaling down device geometries to achieve lower fabrication costs, higher device integration density, higher speeds, and better performance.

One of the IC devices is an image sensor device. An image sensor device includes a pixel grid for detecting light and recording intensity (brightness) of the detected light. The pixel grid responds to the light by accumulating charges. The charges can be used (for example, by other circuitry) to provide color in some suitable applications, such as a digital camera.

Common types of pixel grids include a charge-coupled device (CCD) image sensor or complimentary metal-oxide-semiconductor (CMOS) image sensor device. One type of image sensor devices is a backside illuminated (BSI) image sensor device. BSI image sensor devices are used for sensing a volume of light projected towards a backside surface of a substrate. BSI image sensor devices provide a high fill factor and reduced destructive interference, as compared to frontside illuminated (FSI) image sensor devices. In general, BSI technology provides higher sensitivity, lower cross-talk, and comparable quantum efficiency as compared to FSI image sensor devices.

However, although existing BSI image sensor devices and methods of fabricating these BSI image sensor devices have been generally adequate for their intended purposes, as device scaling-down continues, they have not been entirely satisfactory in all respects.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Figure 1:
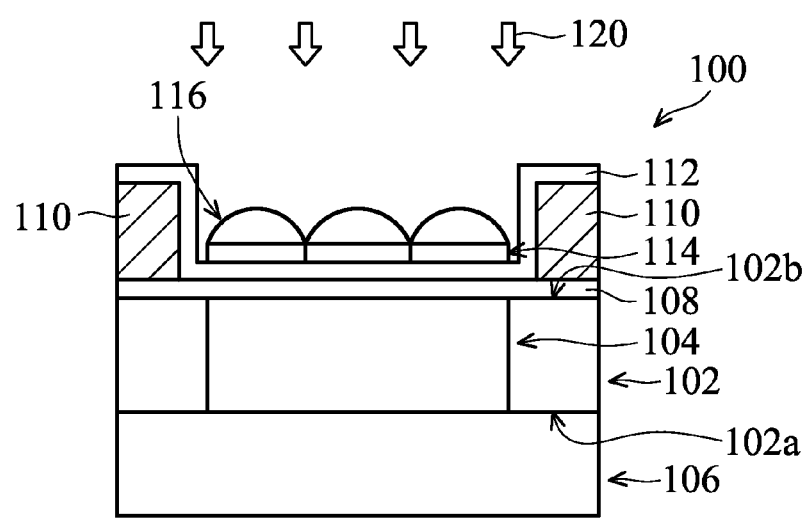
FIG. 1 illustrates a cross section representation of a backside illuminated (BSI) image sensor device structure in accordance with some embodiments.

Mechanisms for forming an integrated circuit (IC) device structure are provided in accordance with some embodiments of the disclosure. In some embodiments, the IC device is a backside illuminated (BSI) image sensor device. FIG. 1 illustrates a cross section representation of a backside illuminated (BSI) image sensor device structure 100 in accordance with some embodiments.

Backside illuminated (BSI) image sensor device structure 100 includes a substrate 102 having a pixel array 104, an interconnect structure 106 formed over a frontside 102a of substrate 102, and an antireflective layer 108 formed over a backside 102b of substrate 102, as shown in FIG. 1 in accordance with some embodiments. In addition, BSI image sensor device structure 100 further includes a radiation shielding layer 110 formed over portions of antireflective layer 108 and a passivation layer 112 formed over the backside of substrate 102 to cover radiation shielding layer 110 and antireflective layer 108. A color filter layer 114 and microlens layer 116 are formed over passivation layer 112 in a pixel area of substrate 102. As shown in FIG. 1, an incident radiation 120 passes through microlens layer 116, color filter layer 114, and antireflective layer 108 sequentially and reaches pixel array 104.

In some embodiments, passivation layer 112 is made of dielectric material such as silicon nitride ($Si_3N_4$). In some embodiments, antireflective layer 108 is also made of silicon nitride. However, when antireflective layer 108 is made of $Si_3N_4$, a refractive index of antireflective layer 108 is similar to a refractive index of passivation layer 112. Therefore, a transmittance of BSI image sensor device structure 100 decreases, resulting from total reflection of incident radiation 120.

In some embodiments, antireflective layer 108 is made of dielectric material such as silicon carbide (SiC). When antireflective layer 108 is made of SiC, the refractive index of antireflective layer 108 is higher than the refractive index of passivation layer 112. Therefore, the transmittance of BSI image sensor device structure 100 may be improved. However, antireflective layer 108 made of SiC tends to trap charges in optical block areas of BSI image sensor device structure 100 (e.g. areas below radiation shielding layer 110), and the dark current in substrate 102 increases.

FIGS. 2A to 2F illustrate cross-section representations of various stages of forming a BSI image sensor device structure 100' in accordance with some embodiments. However, it should be noted that BSI image sensor device structure 100' illustrated in FIGS. 2A to 2F have been simplified for the sake of clarity so that concepts of the present disclosure can be better understood. Therefore, in some other embodiments, additional features are added in BSI image sensor device structure 100', and some of the elements are replaced or eliminated. For example, BSI image sensor device structure 100' is an integrated circuit (IC) chip, system-on-chip (SoC), or a portion thereof, which includes various passive and active microelectronic devices, such as resistors, capacitors, inductors, diodes, metal-oxide-semiconductor field effect transistors (MOSFET), complementary metal-oxide-semiconductor (CMOS) transistors, high-voltage transistors, high-frequency transistors, or other applicable components. In addition, it should be noted that different embodiments may have different advantages than those described herein, and no particular advantage is necessarily required of any embodiment.

In some embodiments, substrate 102 is a semiconductor substrate including silicon. Alternatively or additionally, substrate 102 may include another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. Substrate 102 may be a p-type or an n-type substrate depending on the design requirements of BSI image sensor device structure 100. Substrate 102 may also include isolation features (not shown), such as shallow trench isolation (STI) and/or local oxidation of silicon (LOCOS) features, to separate the pixels (discussed below) and/or other devices formed on substrate 102. In some embodiments, substrate 102 is a device wafer.

Figure 2A:
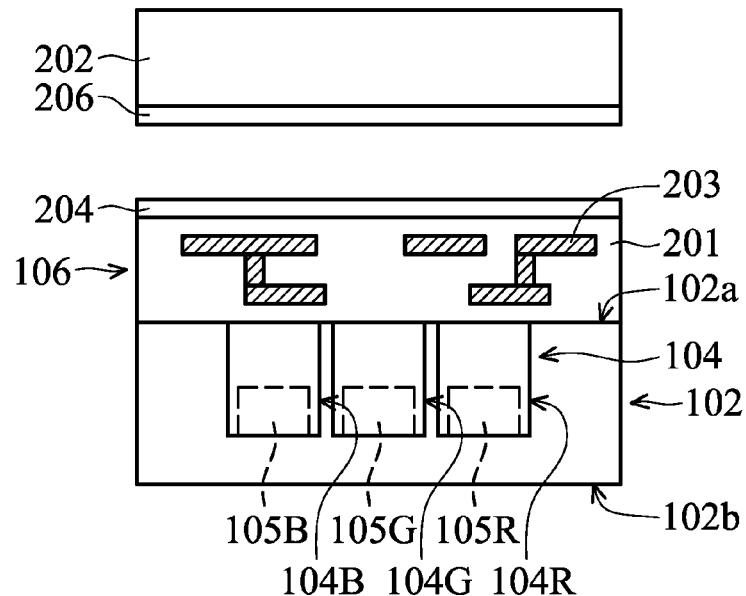
FIGS. 2A to 2F illustrate cross-section representations of various stages of forming a BSI image sensor device structure in accordance with some embodiments.

As shown in FIG. 2A, pixel array 104 is formed in frontside 102a of substrate 102 in accordance with some embodiments. Pixel array 104 includes pixels 104R, 104G, and 104B corresponding to specific wavelengths. For example, pixels 104R, 104G, and 104B respectively correspond to a range of wavelengths of red light, green light, and blue light. Therefore, each of pixels 104R, 104G, and 104B may detect the intensity (brightness) of a respective range of wavelengths. The term "pixel" refers to a unit cell containing features (for example, circuitry including a photodetector and various semiconductor devices) for converting electromagnetic radiation into electrical signals. Pixels 104R, 104G, and 104B may include various features and circuitry allowing them to detect the intensity of incident radiation 120.

In some embodiments, pixels 104R, 104G, and 104B are photodetectors, such as photodiodes, that include light-sensing regions 105R, 105G, and 105B, respectively. Light-sensing regions 105R, 105G, and 105B may be doped regions having n-type and/or p-type dopants formed in substrate 102. Light-sensing regions 105R, 105G, and 105B may be formed by an ion implantation process, diffusion process, or other applicable etching process.

Interconnect structure 106 is formed over frontside 102a of substrate 102, as shown in FIG. 2A in accordance with some embodiments. Interconnect structure 106 includes a dielectric layer 201 and conductive features 203 formed in dielectric layer 201. In some embodiments, dielectric layer 201 includes interlayer (or inter-level) dielectric (ILD) layers or inter-metal dielectric (IMD) layers. In some embodiments, dielectric layer 201 includes multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. Dielectric layer 201 may be formed by a chemical vapor deposition (CVD), physical vapor deposition, (PVD), atomic layer deposition (ALD), spin-on coating, or other applicable process.

Conductive features 203 may be configured to connect various features or structures of BSI image sensor device 100'. For example, conductive features 203 are used to interconnect the various devices formed on substrate 102. Conductive features 203 may be vertical interconnects, such as vias and/or contacts, and/or horizontal interconnects, such as conductive lines. In some embodiments, conductive features 203 are made of conductive materials, such as aluminum, aluminum alloy, copper, copper alloy, titanium, titanium nitride, tungsten, polysilion, or metal silicide.

An adhesive layer 204 is formed over interconnect structure 106 over frontside 102a of substrate 102. In some embodiments, adhesive layer 204 is an oxide layer. Adhesive layer 204 may be formed by chemical vapor deposition (CVD). As shown in FIG. 2A, an adhesive 206 is also formed on a carrier substrate 202. In some embodiments, adhesive layer 206 is an oxide layer. Adhesive layer 206 may be formed by CVD. In some embodiments, adhesive layer 204 and adhesive layer 206 are made of the same material. In some embodiments, carrier substrate 202 is a carrier wafer. In some embodiments, carrier substrate 202 is a glass substrate.

Figure 2B:
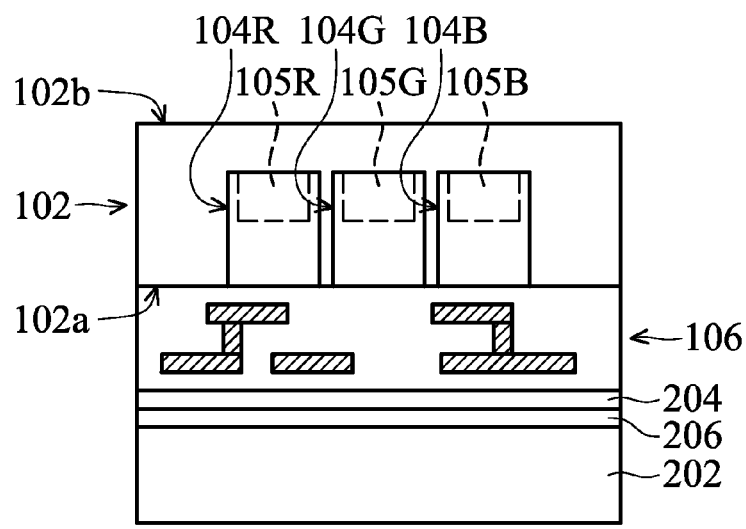

Substrate 102 is bonded to carrier substrate 202 by bonding adhesive layer 204 to adhesive layer 206, as shown in FIG. 2B in accordance with some embodiments. As shown in FIG. 2B, adhesive layer 204 formed on interconnect structure 106 over frontside 102a of substrate 102 is bonded to adhesive layer 206 formed on carrier substrate 202. Therefore, substrate 102 is bonded to carrier substrate 202 through its frontside 102a.

Figure 2C:
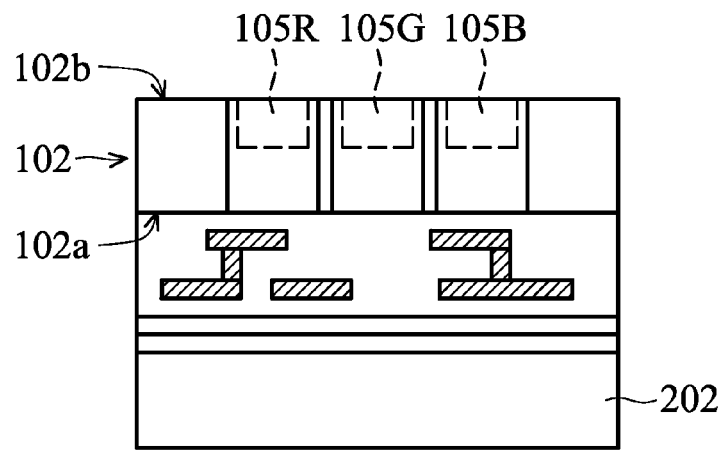

After adhesive layer 204 is bonded to adhesive layer 206, backside 102b of substrate 102 is polished to thin down substrate 102, as shown in FIG. 2C in accordance with some embodiments. As shown in FIG. 2C, substrate 102 is thinned down from its backside 102b to expose light-sensing regions 105R, 105G, and 105B. In some embodiments, substrate 102 is polished by a chemical mechanical polishing (CMP) process.

Figure 2D:
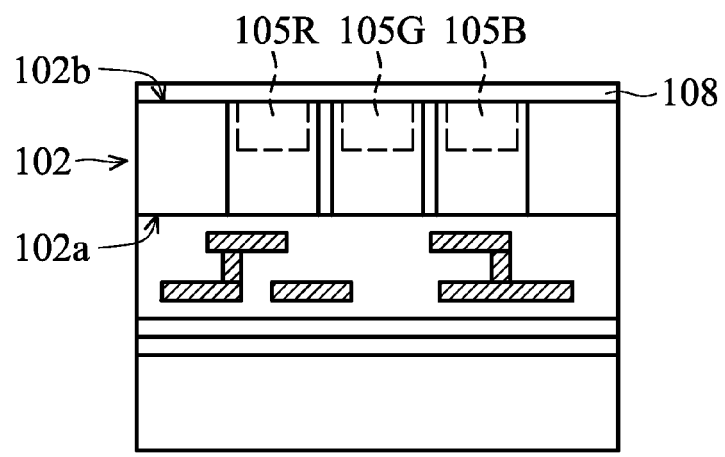

Next, antireflective layer 108 is formed over backside 102b of substrate 102 to cover exposed light-sensing regions 105R, 105G, and 105B, as shown in FIG. 2D in accordance with some embodiments. In some embodiments, antireflective layer 108 is made of silicon carbide nitride. In some embodiments, antireflective layer 108 is made of $SiC_xN_y$, and a ratio of y to x is in a range from about 0.01 to about 0.5. When the ratio of y to x is too large, RI would be lower and might cause record intensity (quantum efficiency) loss. When the ratio of y to x is too small, total electrical charge would be too high and might cause CMOS noise increasing. In some embodiments, the thickness of antireflective layer 108 is in a range from about 100 Å to about 600 Å.

In some embodiments, the refraction index of antireflective layer 108 is in a range from about 2.3 to about 2.6. In some embodiments, the refraction index of antireflective layer 108 is smaller than the refraction index of pixel array 104. In some embodiments, the extinction coefficient (k) of antireflective layer 108 is substantially zero for radiation (light) having wavelengths in a range from about 425 nm to about 650 nm. Antireflective layer 108 made of silicon carbide nitride has a relatively high refraction index (e.g. compared to the refraction index of the antireflective layer made of $Si_3N_4$ being about 1.92), and therefore the transmittance of the resulting BSI image sensor device structure 100' will be improved.

In some embodiments, a total charge ($Q_{total}$) of antireflective layer 108 is in a range from about 1.5E+11 q/cm$^2$ to about 6.5E+11 q/cm$^2$. In some embodiments, a flatband voltage of antireflective layer 108 is in a range from about −2.7 volt to about −12 volt. Since antireflective layer 108 has a relatively larger flatband voltage (e.g. compared to the flatband voltage of silicon carbide being about −11.99), the dark current of the resulting BSI image-sensor device structure 100' will be reduced.

In some embodiments, formation of antireflective layer 108 made of $SiC_xN_y$ can be presented by the following formula:

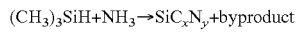

$$(CH_3)_3SiH + NH_3 \rightarrow SiC_xN_y + \text{byproduct}$$

In some embodiments, the byproduct is the formula may be hydrogen, or $C_xH_x$. As described previously, the ratio of y to x is in a range from about 0.01 to about 0.5. In some embodiments, antireflective layer 108 is formed by a chemical vapor deposition (CVD) process, such as a plasma enhanced CVD (PECVD) process. In some embodiments, the PECVD process includes using a gas mixture containing helium (He), ammonia ($NH_3$), and tetramethylsilane (TMS). In some embodiments, a flow rate of He is in a range from about 1000 sccm to about 5000 sccm. In some embodiments, a flow rate of $NH_3$ is in a range from about 5 sccm to about 300 sccm. In some embodiments, a flow rate of TMS is in a range from about 50 sccm to about 300 sccm. The flow rates of each gas may be used to control the composition and thickness of antireflective layer 108. In some embodiments, the ratio of the flow rate of $NH_3$ to the flow rate of TMS is in a range from about 0.2 to about 1.

In some embodiments, during the PECVD process, a chamber pressure is in a range from about 1 Torr to about 30 Torr. In some embodiments, a chamber temperature is in a range from about 300° C. to about 500° C. In some embodiments, a power is in a range from about 100 W to about 500 W.

Figure 2E:
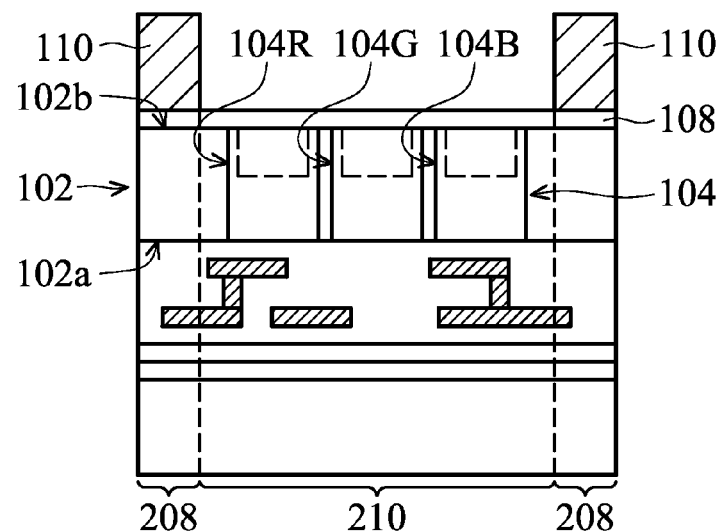

After antireflective layer 108 is formed, radiation shielding layer 110 is formed over antireflective layer 108, as shown in FIG. 2E in accordance with some embodiments. Radiation shielding layer 110 is used to block radiation (light) from passing through, and therefore areas below radiation shielding layer 110 are called optical block areas 208. On the other hand, an area with pixel array 104 formed inside is called a pixel area 210. In some embodiments, pixel area 210 is surrounded by optical block areas 208.

In some embodiments, radiation shielding layer 110 includes one or more metal layers made of metal containing materials such as titanium, titanium nitride, tantalum, tantalum nitride, aluminum, tungsten, copper, or copper alloy. In some embodiments, radiation shielding layer 110 is formed by using a physical vapor deposition (PVD) process or a chemical vapor deposition (CVD) process. In some embodiments, a thickness of radiation shielding layer 110 is in a range from about 100 angstroms to about 1000 angstroms.

Figure 2F:
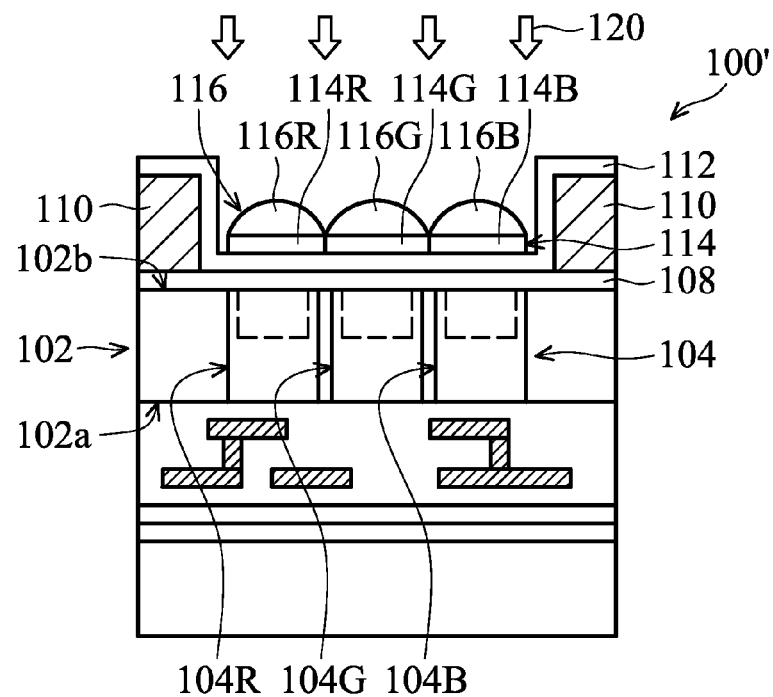

Next, passivation layer 112 is formed conformally over backside 102b of substrate 102, as shown in FIG. 2F in accordance with some embodiments. Passivation layer 112 covers radiation shielding layer 110 in optical block areas 208 and pixel array 104 in pixel area 210. In some embodiments, passivation layer 112 directly contacts radiation shielding layer 110 in pixel area 210 in accordance with some embodiments. Therefore, incident radiation 120 passes through passivation layer 112 and antireflective layer 108 sequentially to reach pixel array 104.

In some embodiments, passivation layer 112 is made of silicon nitride or silicon oxynitride. In some embodiments, a refractive index of passivation layer 112 is lower than 2.2, such as in a range from about 1.8 to about 2.2. In some embodiments, a difference between the refractive index of antireflective layer 108 and the refractive index of passivation layer 112 is in a range from about 0.1 to about 1.0. When the difference between the refractive index of antireflective layer 108 and the refractive index of passivation layer 112 is too small, total reflection may occurs during the operation of BSI image sensor device 100'. In some embodiments, a thickness of passivation layer 112 is in a range from about 250 angstroms to about 4000 angstroms.

After passivation layer 112 is formed, color filter layer 114 is formed over passivation layer 112, and microlens layer 116 is disposed over color filter layer 114, as shown in FIG. 2F in accordance with some embodiments. Color filter layer 114 may include more than one color filter. For example, color filter layer 114 includes color filters 114R, 114G, and 114B. Incident radiation 120 may be filtered by color filter 114R, and the filtered incident radiation 120, such as being transferred into a red light, may reach pixel 104R. Similarly, incident radiation 120 filtered by color filter 114G, such as being transferred into a green light, may reach pixel 104G, and incident radiation 120 filtered by color filter 114B, such as being transferred in to a blue light, may reach pixel 104B. In some embodiments, each of the color filters 114R, 114G, and 114B is aligned with its respective, corresponding pixels 104R, 104G, and 104B.

In some embodiments, color filters 114R, 114G, and 114B are made of a dye-based (or pigment-based) polymer for filtering out a specific frequency band. In some embodiments, color filters 114R, 114G, and 114B are made of a resin or other organic-based material having color pigments.

In some embodiments, microlens layer 116 disposed on color filter layer 114 includes microlens 116R, 116G, and 116B. As shown in FIG. 2F, each of microlens 116R, 116G, and 116B is aligned with one of the corresponding color filters 114R, 114G, and 114B, and therefore is aligned with one of the corresponding pixels 104R, 104G, and 104B. However, it should be noted that microlens 116R, 116G, and 116B may be arranged in various positions in various applications. In addition, microlens 116R, 116G, and 116B may have a variety of shapes and sizes, depending on the refraction index of materials of microlenses 116R, 116G, and 116B and/or the distance between microlenses 116R, 116G, and 116B and light-sensing regions 105R, 105G, and 105B.

In operation, BSI image sensor device structure 100' is designed to receive incident radiation 120 traveling towards backside 102b of substrate 102, as shown in FIG. 2F in accordance with some embodiments. First, microlens layer 116 directs incident radiation 120 to color filter layer 114. Next, incident radiation 120 passes from color filter layer 114 to pixel array 104 through passivation layer 112 and antireflective layer 108. In some embodiments, incident radiation 120 is a visible light, infrared (IR), ultraviolet (UV), X-ray, or microwave.

As described above, refractive index of antireflective layer 108 made of silicon carbide nitride is higher than refractive index of passivation layer 112, and refractive index of pixel array 104 is higher that refractive index of antireflective layer 108. That is, incident radiation 120 passes through layers having various but increasing refractive index. Therefore, amounts of total reflection of incident radiation 120 (e.g. incident light) are greatly decreased. In addition, the decrease of total reflection leads to an increase of transmittance of BSI image sensor device structure 100'. Accordingly, intensity of incident radiation 120 reaching substrate 102 increases, and quantum efficiency of BSI image sensor device structure 100' is improved.

In addition, amounts of charges trapped by antireflective layer 108 made of silicon carbide nitride decreases (e.g. compared to antireflective layer made of silicon carbide), and therefore the dark current of BSI image sensor device structure 100' in optical block area 208 of substrate 101 is also decreased.

Embodiments of mechanisms for a BSI image sensor device structure are provided. The BSI image sensor device structure includes an antireflective layer formed over a backside of a device substrate and a passivation layer formed over the antireflective layer. The antireflective layer is made of silicon carbide nitride. A refractive index of the antireflective layer is larger than a refractive index of the passivation layer. Therefore, transmittance of the BSI image sensor device structure increases, and quantum efficiency of the BSI image sensor device structure is improved. In addition, amounts of charges trapped by the antireflective layer decreases, and therefore dark current of the BSI image sensor device structure also decreases.

In some embodiments, a backside illuminated image sensor device structure is provided. The backside illuminated image sensor device structure includes a substrate having a frontside and a backside and a pixel array formed in the frontside of the substrate. The backside illuminated image sensor device structure further includes an antireflective layer formed over the backside of the substrate, and the antireflective layer is made of silicon carbide nitride In some embodiments, a backside illuminated image sensor device structure is provided. The backside illuminated image sensor device structure includes a substrate having a frontside and a backside and a pixel array formed in the frontside of the substrate. The backside illuminated image sensor device structure further includes an antireflective layer formed over the backside of the substrate, wherein the antireflective layer is made of $SiC_xN_y$, and wherein a ratio of y to x is in a range from about 0.01 to about 0.5.

In some embodiments, a method for forming a backside illuminated image sensor device structure is provided. The method includes providing a device substrate having a pixel array formed in a frontside of the device substrate and forming an interconnect structure over the frontside of the device substrate. The method further includes bonding a carrier substrate to the interconnect structure over the frontside of the device substrate and polishing a backside of the device substrate to expose the pixel array from the backside of the device substrate. The method further includes forming an antireflective layer over the backside of the device substrate to cover the pixel array, and the antireflective layer is made of silicon carbide nitride.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A backside illuminated image sensor device structure comprising:
   a substrate having a frontside and a backside;
   a pixel array formed in the frontside of the substrate;
   an antireflective layer formed over the backside of the substrate, wherein the antireflective layer is made of silicon carbide nitride;
   a radiation shielding layer formed over the antireflective layer over the backside of the substrate;
   a passivation layer formed over the backside of the substrate to cover the radiation shielding layer and the pixel array; and
   a color filter layer formed over the passivation layer, wherein the color filter layer is aligned with the pixel array.

2. The backside illuminated image sensor device structure as claimed in claim 1, wherein the silicon carbide nitride has the following formula:

$$SiC_xN_y,$$

wherein a ratio of y to x is in a range from about 0.01 to about 0.5.

3. The backside illuminated image sensor device structure as claimed in claim 1, wherein a refraction index of the antireflective layer is in a range from about 2.3 to about 2.6.

4. The backside illuminated image sensor device structure as claimed in claim 1, wherein a thickness of the antireflective layer is in a range from about 100 Å to about 600 Å.

5. The backside illuminated image sensor device structure as claimed in claim 1, wherein a refraction index of the antireflective layer is larger than a refraction index of the passivation layer.

6. The backside illuminated image sensor device structure as claimed in claim 5, wherein a difference between the refraction index of the antireflective layer and the refraction index of the passivation layer is in a range from about 0.1 to about 1.0.

7. The backside illuminated image sensor device structure as claimed in claim 1, further comprising:
   a microlens layer disposed over the color filter layer.

8. The backside illuminated image sensor device structure as claimed in claim 1, wherein refraction index of the antireflective layer is smaller than a refraction index of the pixel array.

9. The backside illuminated image sensor device structure as claimed in claim 1, wherein a refractive index of the passivation layer is in a range from about 1.8 to about 2.2.

10. A backside illuminated image sensor device structure, comprising:
    a substrate having a frontside and a backside;
    a pixel array formed in the frontside of the substrate;
    an antireflective layer formed over the backside of the substrate, wherein the antireflective layer is made of $SiC_xN_y$, and wherein a ratio of y to x is in a range from about 0.01 to about 0.5;
    a radiation shielding layer formed over the antireflective layer over the backside of the substrate;
    a passivation layer formed over the backside of the substrate to cover the radiation shielding layer and the pixel array; and
    a color filter layer formed over the passivation layer, wherein the color filter layer is aligned with the pixel array.

11. The backside illuminated image sensor device structure as claimed in claim 10, wherein a refraction index of the antireflective layer is in a range from about 2.3 to about 2.6.

12. The backside illuminated image sensor device structure as claimed in claim 10, wherein a refraction index of the antireflective layer is larger than a refraction index of the passivation layer.

13. The backside illuminated image sensor device structure as claimed in claim 12, wherein a difference between the refraction index of the antireflective layer and the refraction index of the passivation layer is in a range from about 0.1 to about 1.0.

14. The backside illuminated image sensor device structure as claimed in claim 10, further comprising:
a microlens layer disposed over the color filter layer.

15. The backside illuminated image sensor device structure as claimed in claim 10, wherein a thickness of the antireflective layer is in a range from about 100 Å to about 600 Å.

16. The backside illuminated image sensor device structure as claimed in claim 10, wherein a refraction index of the antireflective layer is smaller than a refraction index of the pixel array.

* * * * *